United States Patent
Ding et al.

(10) Patent No.: US 6,577,147 B2
(45) Date of Patent: Jun. 10, 2003

(54) METHOD AND APPARATUS FOR RESISTING PROBE BURN USING SHAPE MEMORY ALLOY PROBE DURING TESTING OF AN ELECTRONIC DEVICE

(75) Inventors: Jun Ding, Portland, OR (US); Jin Pan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/946,622

(22) Filed: Sep. 6, 2001

(65) Prior Publication Data

US 2003/0042923 A1 Mar. 6, 2003

(51) Int. Cl.[7] .............................................. G01R 31/02
(52) U.S. Cl. ...................................... 324/761; 324/754
(58) Field of Search ...................... 324/158.1, 754–761

(56) References Cited

U.S. PATENT DOCUMENTS

| | | |
|---|---|---|
| 5,486,771 A | 1/1996 | Volz et al. |
| 5,524,619 A | 6/1996 | Ouchi et al. |
| 5,555,422 A | 9/1996 | Nakano |
| 5,611,874 A | 3/1997 | Zadno-Azizi et al. |
| 5,619,177 A | 4/1997 | Johnson et al. |
| 5,693,982 A | 12/1997 | Ideta et al. |
| 5,772,105 A | 6/1998 | Zadno-Azizi et al. |
| 5,831,820 A | 11/1998 | Huang |
| 5,841,291 A | 11/1998 | Liu et al. |
| 5,891,577 A | 4/1999 | Breitbach et al. |
| 5,917,240 A | 6/1999 | Ideta et al. |
| 5,936,418 A | 8/1999 | Ideta et al. |
| 6,019,166 A | 2/2000 | Viswanath et al. |
| 6,043,667 A * | 3/2000 | Cadwallader et al. ........ 324/758 |
| 6,049,217 A | 4/2000 | Viswanath et al. |
| 6,049,267 A | 4/2000 | Barnes et al. |
| 6,053,925 A * | 4/2000 | Barnhart ...................... 606/116 |
| 6,133,744 A | 10/2000 | Yojima et al. |
| 6,242,929 B1 * | 6/2001 | Mizuta ......................... 324/754 |
| 6,246,245 B1 | 6/2001 | Akram et al. |
| 2001/0011897 A1 * | 8/2001 | Hamel et al. ................ 324/754 |

OTHER PUBLICATIONS

Lagoudas, D. Introduction to Shape Memory Alloys(SMA) [online], [retrieved on May 17, 2002]. Retrieved from the Internet:<URL: http://smart.tamu.edu/>.*

* cited by examiner

Primary Examiner—Kamand Cuneo
Assistant Examiner—Paresh Patel
(74) Attorney, Agent, or Firm—Antonelli, Terry, Stout & Kraus, LLP

(57) ABSTRACT

A probe burn resistant interface apparatus and method for testing an electronic device use a probe made of a shape memory alloy which upon overheating of the probe during functionality testing of an electronic device contracts the probe to disengage the probe from a contact electrically connected to the electronic device and stop current flow through the probe. Upon cooling of the probe, engagement of the probe with the contact is reestablished. The probe in an example embodiment is a wire which has a core made of a shape memory alloy and a layer of a highly elastic metal, for example copper, on an outer surface of the core to aid return of the probe from its contracted state to its initial state upon cooling an overheated probe for reestablishing electrical connection of the probe with the electronic device being tested.

24 Claims, 1 Drawing Sheet

METHOD AND APPARATUS FOR RESISTING PROBE BURN USING SHAPE MEMORY ALLOY PROBE DURING TESTING OF AN ELECTRONIC DEVICE

TECHNICAL FIELD

The present invention relates to functionality testing of electronic devices using probes electrically connecting a tester to the electronic devices to be tested. More particularly, the present invention is directed to an improved method and apparatus for resisting probe burn resulting from excessive current caused overheating during such testing.

BACKGROUND

It is known to provide a sort interface unit (SIU)/test interface unit (TIU) between a tester and a prober/handler for conducting electrical power/signal from a tester head to an electronic device under test for the purpose of functionality testing. A common seen failure mechanism in sort and test is SIU/TIU burn. The root cause of SIU/TIU burn is excessive current caused overheating.

The core speed of logic products increases dramatically from generation to generation. To meet the test requirements, higher power and smaller pitch size are required, which in turn worsen the SIU/TIU burn situation. Currently, once the burn happens, the SIU/TIU needs to be repaired, or retired if the burn is too severe, generating varying productivity and cost impact depending on severity of the burn. There is a need for an improved method and apparatus for electrically connecting a tester to an electronic device to be tested which address the problem of probe burn.

The present invention addresses this need. Features and advantages of the present invention will become more apparent from the following detailed description when taken in connection with the accompanying drawings which show, for purposes of illustration only, one example embodiment in accordance with the present invention.

DETAILED DESCRIPTION

Figure 1:
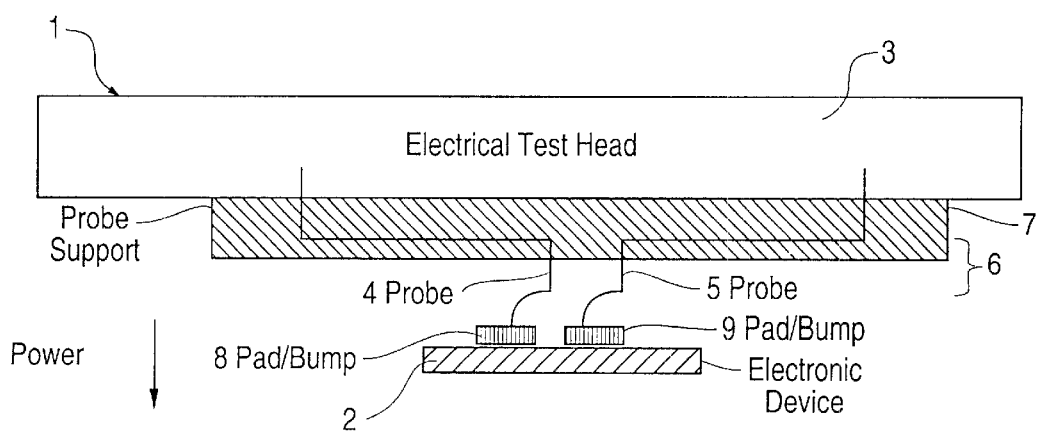
FIG. 1 is a schematic drawing, not to scale, of an apparatus for performing a functionality test of an electronic device according to a method of the invention.

Referring now to FIG. 1 of the drawings, an apparatus 1 for performing a functionality test of an electronic device 2 comprises a tester represented by a test head 3 as depicted in the drawing. The tester is capable of conducting a functionality test or other electrical test of the electronic device 2 by way of probes 4 and 5 of an interface unit 6 of the tester. The probes 4 and 5 are connected to a probe support 7 of the interface unit which, in turn, is releasably mounted on the test head 3 of the tester. In this way, the probes are electrically connected to the tester and extend outwardly therefrom for engaging respective contacts 8 and 9 in the form of pads/bumps on the electronic device 2 to be tested. For the convenience of the drawings, only two probes are shown on the interface unit 6, but it should be understood that in a real situation up to several thousand of the probes may be needed on the interface unit 6.

The probes 4 and 5 are each formed of a shape memory alloy which upon excess current caused overheating of the probe during testing contracts the probe, reducing its length to disengage the probe from its contact on the electronic device. Because of this construction and function of the probes according to the invention, the interface unit 6 is much more burn-resistant than current interface units which employ "PALINEY 7" or other probe alloys. That is, according to the present invention, the interface unit is advantageously made burn resistant by the use of probes made of shape memory alloy. During probing, if any overheating due to excessive current flow in the probe occurs, the probe will contract. The contact between the probe and the pad/bump will be broken and current flow through the probe will be interrupted. Upon cooling, the probe will return to its original length and contact will be reestablished.

In the example embodiment, each of the probes 4 and 5 is in the form of a wire made of a shape memory alloy. The shape memory alloy is a nickel-titanium alloy in the example embodiment but other shape memory alloys could be employed. The wire diameter is 0.002 to 0.004 inch in the example embodiment. In other applications, it is envisioned that the diameter, geometry and shape of the wire can be different from the illustrated embodiment. Upon overheating, the probes contract until they disengage from contact with their respective bumps. The contracted probes are stretched out again as they cool down to room temperature. The outer, free end of the wire probes serve as contact portions of the probes for engaging the pads/bumps 8 and 9 electrically connected to the electronic device 2 to be tested.

Figure 2A:
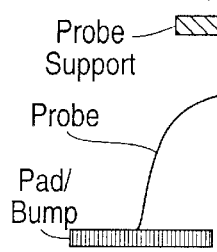
FIG. 2(a) is a schematic drawing of an electronic device being tested using the apparatus of FIG. 1 and according to a method of the invention under normal test conditions.
Figure 2B:
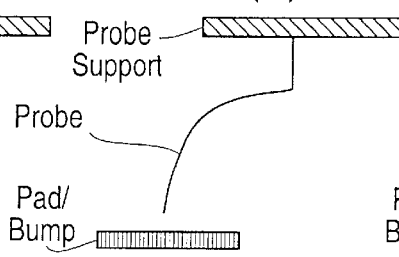
FIG. 2(b) is a schematic drawing like that in FIG. 2(a) but showing the electronic device being tested in relation to the probe of the apparatus after excessive current has caused the probe to overheat and contract, disconnecting the probe from the electronic device.

During fabrication, the probes 4 and 5 are preferably first formed to the desired shape/length at service temperature during testing, see FIG. 2(a). The probes exhibit a shape memory behavior which contracts the probe to a second, memorized length when the probe is heated to a second, overheated temperature during testing, see FIG. 2(b). This unusual behavior is called shape memory. It is connected with that type of solid-state phase transformation known as martensitic phase transformation.

Figure 3:
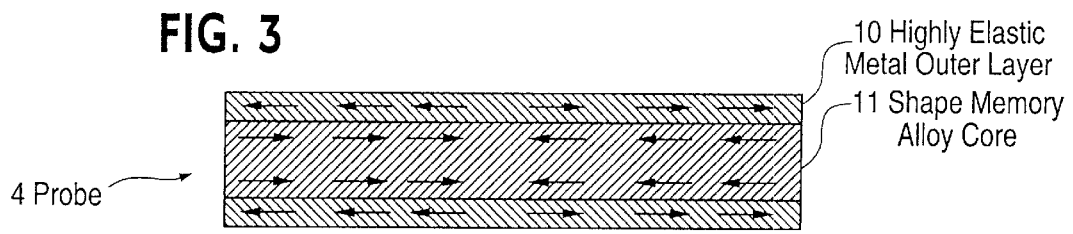
FIG. 3 is a schematic, cross-sectional view through the longitudinal center of a probe wire according to the example embodiment of the invention, the probe wire comprising a core of a shape memory alloy and an outer layer of a highly elastic metal which aids in restoring the overheated, contracted probe wire to its initial length upon cooling of the probe wire.

According to a further feature of the invention, a light external mechanical force is used to help the probe back to its original length (at normal service temperature). This is realized in the example embodiment by providing an outer layer 10 of a highly elastic metal on the outside of the shape memory alloy core 11 of the probe as shown in FIG. 3. In the example embodiment, the highly elastic outer layer is copper which has been coated on the core by electroless deposition. For example, the thickness of the copper layer is 2.56 microns for a 0.003 inch diameter core. When the core 11 of the wire contracts upon being overheated during testing, the outer layer 10 will be under a compression force and will exert a tensile force on the core of the wire to help it back to its original length upon cooling of the probe wire.

Figure 2C:
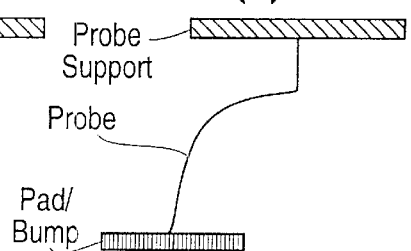
FIG. 2(c) is a schematic drawing like FIGS. 2(a) and 2(b) but showing the overheated probe of FIG. 2(b) upon cooling down, the probe returning to its original length, restoring electrical contact of the probe with the pad/bump on the electronic device.

These forces are schematically illustrated by the directional arrows on the core and outer layer of the probe 4 in FIG. 3. The effect is to aid restoration of the probe wire from its contracted condition depicted in FIG. 2(b) to its original position, reestablishing contact with the electronic device as shown in FIG. 2(c).

While we have shown and described only a single embodiment in accordance with the present invention, it is understood that the same is not limited thereto, but is susceptible to numerous changes and modifications as known to those skilled in the art. For example, a light external mechanical force to aid the probe back to its original length can be provided by adding a spring in the probe head. Shape memory alloys other than the nickel-titanium alloy of the example embodiment could also be used. The configuration of the probe wires could also be varied. Therefore, we do not wish to be limited to the details shown and described herein, but intend to cover all such changes and modifications as are encompassed by the scope of the appended claims.

We claim:

1. An interface apparatus for use in testing an electronic device, the apparatus comprising:
   a probe support to interface with a test head of a tester;
   a probe connected to the probe support, the probe having an outer, free end which serves as a contact portion of the probe for engaging a contact electrically connected to an electronic device to be tested;
   wherein the probe contains a shape memory alloy and has a first length at a temperature corresponding to a first, service temperature of the probe during testing, the probe exhibiting a shape memory behavior which contracts the probe to a second, memorized length to disengage the outer, free end of the probe from the contact when the probe is heated to a second, overheated temperature during testing.

2. The apparatus according to claim 1, wherein the probe is in the form of a wire.

3. The apparatus according to claim 2, wherein the free end of the wire serves as the contact portion of the probe for engaging a contact electrically connected to an electronic device to be tested.

4. The apparatus according to claim 2, wherein the wire has a diameter of 0.002 to 0.004 inch.

5. The apparatus according to claim 1, wherein the shape memory alloy is a Ni—Ti Alloy.

6. The apparatus according to claim 1, wherein a plurality of probes are connected to and extend outwardly from the probe support for engaging respective ones of a plurality of contacts electrically connected to at least one electrical device to be tested.

7. An interface apparatus for use in testing an electronic device, the apparatus comprising:
   a probe support to interface with a test head of a tester;
   a probe connected to the probe support;
   wherein the probe contains a shape memory alloy, wherein the probe is in the form of a wire, and wherein the wire has a core made of the shape memory alloy and a layer of a highly elastic metal on an outer surface of the core to aid return of the probe from a contracted, overheated state to its initial state upon cooling an overheated probe for re-establishing engagement of the probe with a contact electrically connected to an electronic device being tested.

8. The apparatus according to claim 7, wherein the layer of highly elastic metal on the outer surface of the core is copper.

9. An apparatus for electrically connecting a tester to an electronic device to be tested, the apparatus comprising:
   a probe support;
   a probe connected to the probe support and extending outwardly therefrom for engaging a contact electrically connected to an electronic device to be tested;
   wherein the probe contains a shape memory alloy which upon overheating of the probe during testing contracts the probe to disengage the probe from a contact electrically connected to an electronic device being tested.

10. The apparatus according to claim 9, wherein the probe is in the form of a wire.

11. The apparatus according to claim 10, wherein the wire has a diameter of 0.002 to 0.004 inch.

12. The apparatus according to claim 10, wherein a free end of the wire serves as contact portion of the probe for engaging a contact electrically connected to an electronic device to be tested.

13. The apparatus according to claim 10, wherein the wire has a core made of the shape memory alloy and a layer of a highly elastic metal on an outer surface of the core to aid return of the probe from its contracted, overheated state to its initial state upon cooling an overheated probe for re-establishing engagement of the probe with a contact electrically connected to an electronic device being tested.

14. The apparatus according to claim 13, wherein the layer of highly elastic metal on the outer surface of the core is copper.

15. The apparatus according to claim 9, wherein the shape memory alloy is a Ni—Ti alloy.

16. The apparatus according to claim 9, wherein a plurality of probes are connected to and extend outwardly from the probe support for engaging respective ones of a plurality of contacts electrically connected to at least one electrical device to be tested.

17. The apparatus according to claim 9, wherein the probe is formed to have a first length at a temperature corresponding to a first, service temperature of the probe during testing, the probe exhibiting a shape memory behavior which contracts the probe to a second, memorized length when the probe is heated to a second, overheated temperature during testing.

18. The apparatus according to claim 17, wherein the probe has an outer, free end which serves as a contact portion of the probe for engaging a contact electrically connected to an electronic device to be tested, and wherein the length of the probe is reduced to disengage the outer, free end of the probe from the contact when the probe is overheated to the second temperature.

19. An apparatus for performing a functionality test of an electronic device, the apparatus comprising:
   a tester;
   an electrical probe connected to the tester, the probe having an outer, free end which serves as a contact portion of the probe for engaging a contact electrically connected to an electronic device to be tested;
   wherein the probe contains a shape memory alloy and has a first length at a temperature corresponding to a first, service temperature of the probe during testing, the probe exhibiting a shape memory behavior which contracts the probe to a second, memorized length to disengage the outer, free end of the probe from the contact when the probe is heated to a second, overheated temperature during testing.

20. The apparatus according to claim 19, further comprising:

an interface unit coupled between the tester and the electrical probe.

21. A method of resisting probe burn during testing of an electronic device, the method comprising:

electrically connecting a tester to an electronic device to be tested by engaging a shape memory alloy probe extending from the tester with a contact electrically connected to the electronic device to be tested;

conducting an electric current through the probe between the tester and the electronic device; and upon excess current caused overheating of the probe during testing, a shape memory behavior of the probe contracting the probe to disengage the probe from the contact and stop current flow through the probe.

22. The method according to claim 21, wherein the probe is in the form of a wire, and wherein a free end of the wire engages the contact for electrically connecting the tester to the electronic device to be tested.

23. The method according to claim 21, including, after an excess current caused overheating and contraction of the probe, restoring the contracted probe to its initial state upon cooling the probe.

24. The method according to claim 23, wherein the restoring includes applying a tensile force on the probe with a layer of a highly elastic metal provided on an outer surface of the probe.

* * * * *